US011909375B2

(12) United States Patent
Umeda et al.

(10) Patent No.: US 11,909,375 B2
(45) Date of Patent: Feb. 20, 2024

(54) RESONANCE DEVICE

(71) Applicant: Murata Manufacturing Co., Ltd., Nagaokakyo (JP)

(72) Inventors: Keiichi Umeda, Nagaokakyo (JP); Naoto Yatani, Nagaokakyo (JP); Ryota Kawai, Nagaokakyo (JP); Yoshihisa Inoue, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 478 days.

(21) Appl. No.: 17/195,856

(22) Filed: Mar. 9, 2021

(65) Prior Publication Data

US 2021/0194454 A1    Jun. 24, 2021

Related U.S. Application Data

(63) Continuation of application No. PCT/JP2019/040867, filed on Oct. 17, 2019.

(30) Foreign Application Priority Data

Oct. 24, 2018 (JP) .................... 2018-200146

(51) Int. Cl.
  *H03H 9/02* (2006.01)
  *H03H 9/17* (2006.01)
  *H03H 9/15* (2006.01)

(52) U.S. Cl.
  CPC ......... *H03H 9/02244* (2013.01); *H03H 9/17* (2013.01); *H03H 2009/02322* (2013.01);
  (Continued)

(58) Field of Classification Search
  CPC ............... H03H 9/02244; H03H 9/17; H03H 2009/02322; H03H 2009/02496; H03H 2009/155
  See application file for complete search history.

(56) References Cited

U.S. PATENT DOCUMENTS 10,291,202 B2    5/2019   Yamada et al.
2005/0184627 A1   8/2005   Sano et al.
(Continued)

FOREIGN PATENT DOCUMENTS

JP    2006191356 A    7/2006
JP    2007036915 A    2/2007
(Continued)

OTHER PUBLICATIONS

International Search Report issued for PCT/JP2019/040867, dated Dec. 3, 2019.
(Continued)

*Primary Examiner* — Samuel S Outten
(74) *Attorney, Agent, or Firm* — ArentFox Schiff LLP (57) ABSTRACT

A resonance device is provided for reducing the influence on the resonant frequency of the resonance device of the electric charge borne by an insulating film of a frame. The resonance device includes a resonator including a vibration portion and a frame disposed in at least a part of a vicinity of the vibration portion. The frame includes a holding body and an insulating film, with the holding body holding the vibration portion to vibrate and the insulating film being formed above the holding body. A lower cover is provided having a recess forming at least a part of a space in which the vibration portion vibrates. An inner side surface of the insulating film is disposed at a first distance from an inner surface of a side wall defining the recess.

20 Claims, 7 Drawing Sheets

(52) U.S. Cl.
CPC ............. *H03H 2009/02496* (2013.01); *H03H 2009/155* (2013.01)

(56) References Cited

U.S. PATENT DOCUMENTS

| | | |
|---|---|---|
| 2015/0188515 A1 | 7/2015 | Yamada et al. |
| 2016/0197597 A1 | 7/2016 | Yamada et al. |
| 2017/0187351 A1* | 6/2017 | Goto .................... B06B 1/0603 |
| 2018/0175794 A1* | 6/2018 | Yamazaki ............ H03H 3/0072 |
| 2019/0089321 A1 | 3/2019 | Morinaga |
| 2019/0109578 A1 | 4/2019 | Goto et al. |

FOREIGN PATENT DOCUMENTS

| | | | |
|---|---|---|---|
| JP | 2012065293 A | 3/2012 | |
| JP | 2015128268 A | 7/2015 | |
| WO | 2015041152 A1 | 3/2015 | |
| WO | 2017212677 A1 | 12/2017 | |
| WO | 2018008198 A1 | 1/2018 | |

OTHER PUBLICATIONS

Written Opinion of the International Searching Authority issued for PCT/JP2019/040867, dated Dec. 3, 2019.

Japanese Office Action issued for corresponding JP Patent Application No. 2020-553283, dated Mar. 4, 2022.

\* cited by examiner

RESONANCE DEVICE

CROSS REFERENCE TO RELATED APPLICATIONS

The present application is a continuation of PCT/JP2019/040867 filed Oct. 17, 2019, which claims priority to JP Application No. 2018-200146, filed Oct. 24, 2018, the entire contents of each of which are incorporated herein by reference.

TECHNICAL FIELD

The present invention relates to a resonance device.

BACKGROUND

Resonators manufactured by using micro electro mechanical systems (MEMS) technology (hereinafter, such resonators being also referred to as "MEMS vibrators") have attracted attention.

The resonant frequency of such a MEMS vibrator sometimes varies due to manufacturing variations. Thus, during or after manufacturing such a MEMS vibrator, the frequency is adjusted by, for example, additional etching.

For example, Japanese Unexamined Patent Application Publication No. 2012-065293 (hereinafter "Patent Document 1") discloses a known vibration piece that includes a base, a vibration arm extending from the base in the Y-axis direction and configured to bend and vibrate in the Z-axis direction, a piezoelectric element disposed on the vibration arm and configured to bend and vibrate the vibration arm, and a mass portion disposed closer to a tip of the vibration arm than the piezoelectric element. The piezoelectric element at least includes a first electrode layer, a second electrode layer, and a piezoelectric layer positioned between the first electrode layer and the second electrode layer. The mass portion includes at least one film. Moreover, the film is made of the same material as that for one of the layers forming the piezoelectric element.

Existing resonators have a configuration in which a rectangular vibration portion (vibration body) is connected to a frame via a holding arm and in which a surface of the frame is covered with an insulating film. In the resonators having such a configuration, an insulating film of the frame may be electrified due to, for example, an electric field generated during thin film formation. In addition, when such a frequency adjusting method using ion beams described in Patent Document 1 is used in existing resonators, an insulating film of the frame may be electrified due to the frame being irradiated with an ion beam. In addition, when a pyroelectric material is used for an insulating film of the frame, an electric charge is generated at the interface of the insulating film due to a pyroelectric effect caused by temperature changes. As described above, when an insulating film of the frame disposed around a vibration portion is electrified, a Coulomb force (e.g., an electrostatic force) is generated by the electric charge at the insulating film, and the spring constant of the vibration portion thus changes. As a result, the resonant frequency changes.

SUMMARY OF THE INVENTION

The exemplary embodiments of the present invention are made in view of such circumstances. Thus, it is an object of the present invention to provide a resonance device constructed to reduce the influence, on the resonant frequency of the resonance device, of the electric charge borne by an insulating film of a holding portion.

In one aspect, a resonance device is provided that includes a resonator including a vibration body and a frame disposed in at least a part of a vicinity of the vibration body. Moreover, the frame includes a holding body and an insulating film, with the holding body holding the vibration portion configured to vibrate and the insulating film being formed above the holding body. A lower cover is provided having a recess forming at least a part of a space in which the vibration portion vibrates. An inner side surface of the insulating film is disposed at a first distance from an inner surface of a side wall defining the recess.

DETAILED DESCRIPTION OF EMBODIMENTS

Exemplary embodiments of the present invention will be described below. In the following drawings, the same or similar components are represented by the same or similar reference signs. The drawings are illustrative and schematically illustrate the dimensions and the shapes of the components. Thus, the technical scope of the present invention should not be construed as being limited to the embodiments.

First Exemplary Embodiment

Figure 1:
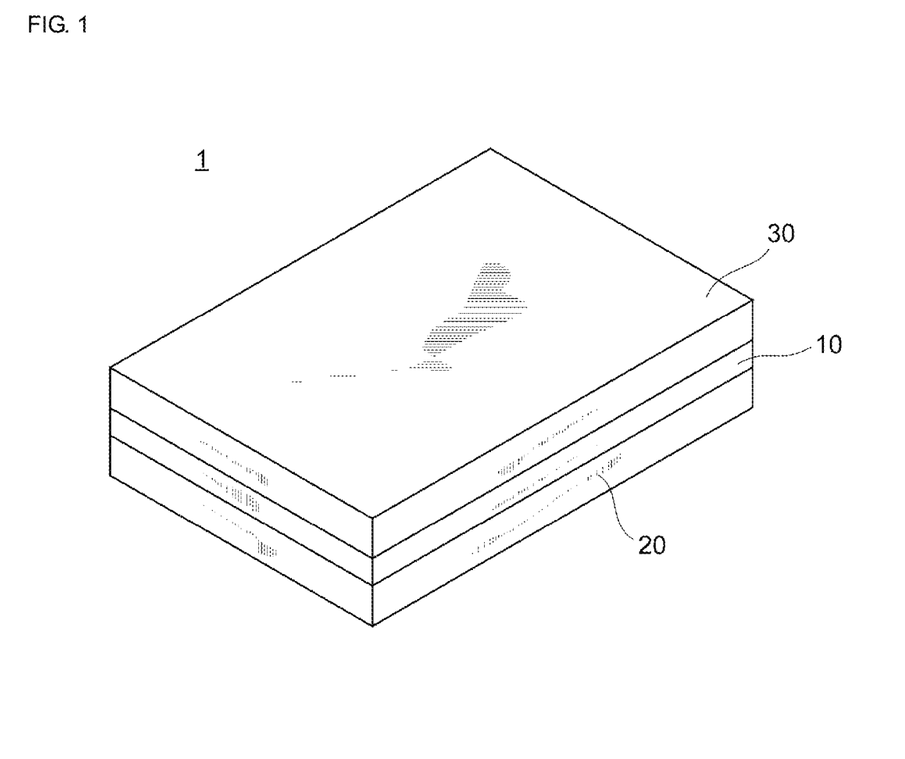
FIG. 1 is a perspective view schematically illustrating the exterior of a resonance device according to a first exemplary embodiment.
Figure 2:
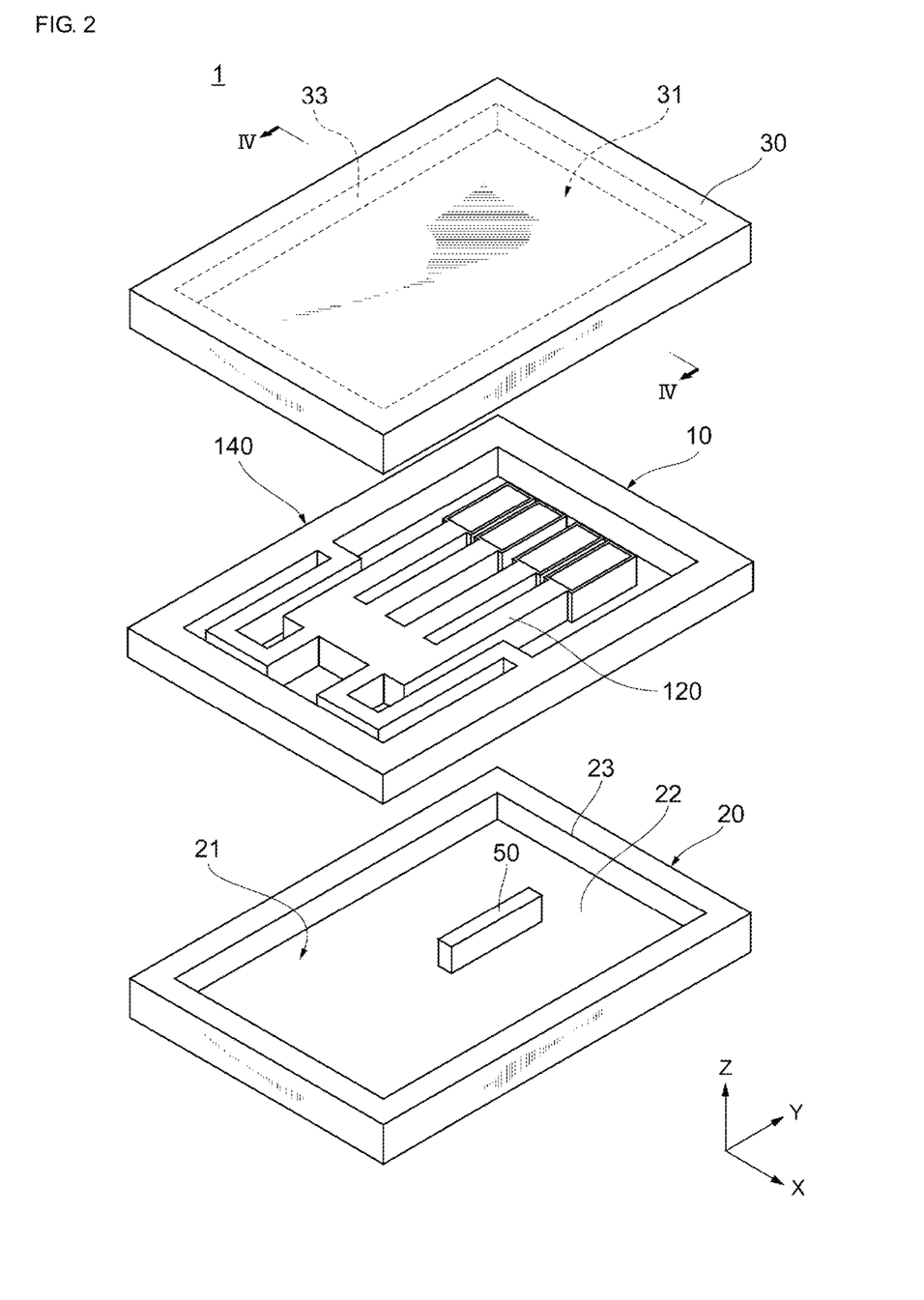
FIG. 2 is an exploded perspective view schematically illustrating the structure of the resonance device illustrated in FIG. 1.

First, a schematic configuration of a resonance device according to a first exemplary embodiment (i.e., Embodiment 1) will be described with reference to FIGS. 1 and 2. FIG. 1 is a perspective view schematically illustrating the exterior of a resonance device 1 according to Embodiment 1. FIG. 2 is an exploded perspective view schematically illustrating the structure of the resonance device 1 illustrated in FIG. 1.

The resonance device 1 includes a lower cover 20, a resonator 10, and an upper cover 30. That is, the resonance device 1 has a configuration in which the lower cover 20, the resonator 10, and the upper cover 30 are laminated in this order. The lower cover 20 and the upper cover 30 are disposed so as to face each other with the resonator 10 interposed therebetween. The lower cover 20 corresponds to an example of "first substrate" in an exemplary aspect of the present disclosure. The upper cover 30 corresponds to an example of "second substrate" in an exemplary aspect of the present disclosure.

Hereinafter, each configuration of the resonance device 1 will be described. In the following descriptions, the side of the resonance device 1 on which the upper cover 30 is disposed is an upper side (or a front side), and the side of the resonance device 1 on which the lower cover 20 is disposed is a lower side (or a back side).

According to an exemplary aspect, the resonator 10 is a MEMS vibrator manufactured by using MEMS technology. The resonator 10 and each of the lower cover 20 and the upper cover 30 are joined so as to seal the resonator 10 and to form a space in which the resonator 10 vibrates. The resonator 10 and the lower cover 20 are each made of a silicon (Si) substrate (hereinafter referred to as "Si substrate"), and the Si substrates are joined to each other. The resonator 10 and the lower cover 20 may be each made of an SOI substrate.

The upper cover 30 flatly extends along the XY-plane. A recess 31, which has, for example, a flat cuboid shape, is formed at the back of the upper cover 30. The recess 31 is surrounded by a side wall 33 and forms a part of the space for vibration that is the space in which the resonator 10 vibrates. The upper cover 30 may be configured to be flat and not to have the recess 31.

The lower cover 20 has a bottom plate 22, which has a flat rectangular shape and is disposed along the XY-plane, and a side wall 23, which extends from the periphery of the bottom plate 22 in the Z-axis direction, that is, the direction in which the lower cover 20 and the resonator 10 are laminated. A recess 21, which is defined by a surface of the bottom plate 22 and an inner surface of the side wall 23, is formed on the surface facing the resonator 10 of the lower cover 20. The recess 21 forms at least a part of the space in which the resonator 10 vibrates.

The space in which the resonator 10 vibrates is airtightly sealed with the upper cover 30 and the lower cover 20 described above and is maintained under vacuum. The space in which the resonator 10 vibrates may be filled with a gas such as an inert gas.

A projection 50, which projects from the bottom plate 22 into the space for vibration, is formed on an inner surface of the lower cover 20, that is, the surface of the bottom plate 22. A specific configuration of the projection 50 will be described later.

Figure 3:
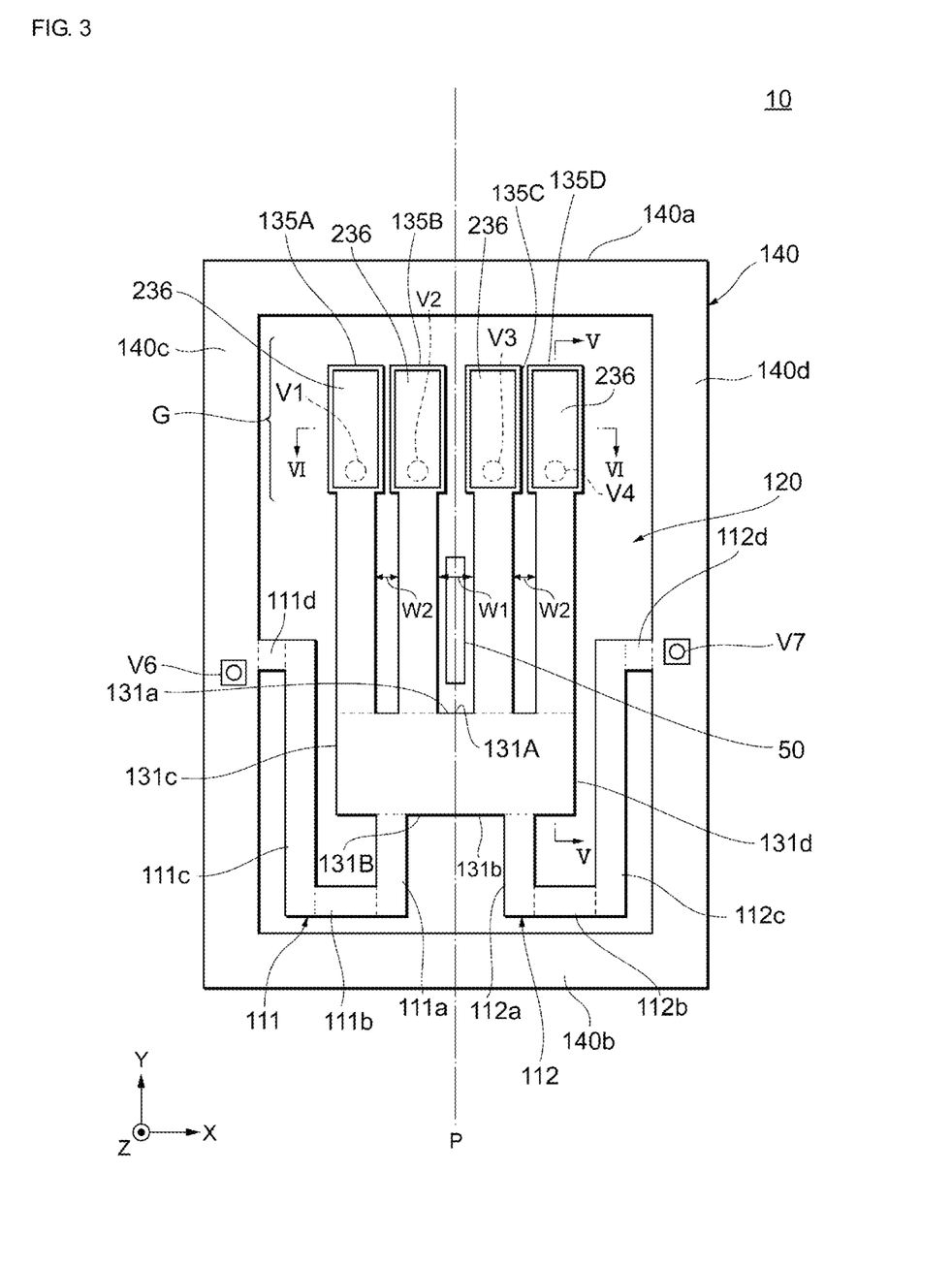
FIG. 3 is a plan view schematically illustrating the structure of a resonator illustrated in FIG. 2.

Next, a schematic configuration of the resonator 10 according to an exemplary embodiment will be described with reference to FIG. 3. FIG. 3 is a plan view schematically illustrating the structure of the resonator 10 illustrated in FIG. 2.

As illustrated in FIG. 3, the resonator 10 is a MEMS vibrator manufactured by using MEMS technology and generates out-of-plane vibration on the XY-plane of the orthogonal coordinate system in FIG. 3. It is noted that the resonator 10 is not limited to a resonator that uses an out-of-plane bending vibration mode. The resonator of the resonance device 1 may be a resonator that uses, for example, an expansion vibration mode, a thickness longitudinal vibration mode, a Lamb-wave vibration mode, an in-plane bending vibration mode, or a surface-acoustic-wave vibration mode. Such a vibrator is applied to, for example, timing devices, RF filters, duplexers, ultrasonic transducers, gyro sensors, and accelerometers. In addition, such a vibrator may be used for, for example, piezoelectric mirrors having an actuator function, piezoelectric gyroscopes, optical-scanner-type MEMS mirrors, piezoelectric microphones having a pressure sensor function, and ultrasonic vibration sensors. In addition, such a vibrator may be applied to electrostatic MEMS elements, electromagnetic-drive MEMS elements, and piezoresistive MEMS elements. In addition, such a vibrator is also usable for megahertz oscillators by being applied to megahertz vibrators.

The resonator 10 includes a vibration portion 120 (e.g., a vibration body), a holding portion 140 (e.g., a frame), a holding arm 110, and vias V1, V2, V3, and V4.

The vibration portion 120 has a rectangular outline extending along the XY-plane of the orthogonal coordinate system in FIG. 3. The vibration portion 120 is disposed inside the holding portion 140. A space is formed between the vibration portion 120 and the holding portion 140 with a predetermined distance therebetween. In the example in FIG. 3, the vibration portion 120 includes a base 130 and four vibration arms 135A to 135D (hereinafter also collectively referred to as "vibration arms 135"). It is noted that the number of vibration arms is not limited to four and is set to any number equal to or more than two, for example, according to alternative aspects. In the present embodiment, the vibration arms 135 and the base 130 are integrally formed.

When the main surface of the resonator 10 is viewed in plan view (hereinafter simply referred to as "plan view"), the base 130 has long sides 131$a$ and 131$b$ in the X-axis direction and short sides 131$c$ and 131$d$ in the Y-axis direction. The long side 131$a$ is a side of a front end surface (hereinafter also referred to as "front end 131A") of the base 130. The long side 131$b$ is a side of a rear end surface (hereinafter also referred to as "rear end 131B") of the base 130. In the base 130, the front end 131A and the rear end 131B are disposed so as to face each other.

The base 130 is connected to the vibration arms 135 (described later) at the front end 131A. The base 130 is connected to holding arms 111 and 112 (described later) at the rear end 131B, which opposes the front end 131A. In the example illustrated in FIG. 3, the base 130 has a substantially rectangular shape in plan view, but the shape of the base 130 is not limited thereto. For example, it is simply required that the base 130 be formed substantially symmetrically with respect to an imaginary plane P defined along a perpendicular bisector of the long side 131$a$. The base 130 may have, for example, a trapezoidal shape in which the long side 131$b$ is shorter than the long side 131$a$ or a semicircular shape whose diameter is the long side 131$a$. The long sides 131$a$ and 131$b$ and the short sides 131$c$ and 131$d$ are not limited to a straight line and may be a curved line.

In the base 130, the base length (each length of the short sides 131$c$ and 131$d$ in FIG. 3) that is the longest distance between the front end 131A and the rear end 131B in a direction from the front end 131A toward the rear end 131B is about 40 μm. The base width (each length of the long sides 131$a$ and 131$b$ in FIG. 3) that is the longest distance between the side ends of the base 130 in the width direction orthogonal to the direction of the base length is about 285 μm.

The vibration arms 135 extend in the Y-axis direction and have the same size. The vibration arms 135 are each disposed parallel to the Y-axis direction between the base 130 and the holding portion 140. As shown, one end of each of the vibration arms 135 is connected to the front end 131A of the base 130 to be a fixed end, and the other end is an open end that is disposed opposite thereof. The vibration arms 135 are disposed side by side (e.g., in parallel) with a predetermined distance in the X-axis direction therebetween. The vibration arms 135 each have a width in the X-axis direction of about 50 μm and a length in the Y-axis direction of about 420 μm, for example.

Preferably, the vibration arms 135 each have a weight portion G at the corresponding open end. The weight portion G has a width in the X-axis direction larger than the other part of the vibration arm 135. The weight portion G has a width in the X-axis direction of about 70 μm, for example. The weight portion G is integrally formed with the vibration arm 135 by the same process. The vibration arm 135 has the weight portion G, and a part closer to the open end of the vibration arm 135 is thus heavier than a part closer to the fixed end of the vibration arm 135 per unit length. Accordingly, the vibration arms 135 each having the weight portion G at the part closer to the corresponding open end enable an increase in the amplitude of vibration of each vibration arm in the up-down direction.

In the vibration portion 120 in the present embodiment, the two vibration arms 135A and 135D are disposed on the outside in the X-axis direction, and the two vibration arms 135B and 135C are disposed on the inside in the X-axis direction. A distance W1 between the vibration arms 135B and 135C in the X-axis direction is set to be larger than a distance W2 between the vibration arm 135A (135D), which is on the outside in the X-axis direction, and the vibration arm 135B (135C), which is on the inside in the X-axis direction and is adjacent to the vibration arm 135A (135D) on the outside. The distance W1 is, for example, about 35 μm. The distance W2 is, for example, about 25 μm. The vibration characteristics are improved by setting the distance W2 to be smaller than the distance W1. To reduce the size of the resonance device 1, the distance W1 may be set to be smaller than the distance W2 or may be set to be equal to the distance W2.

An insulating film 235 is formed on a surface (e.g., the surface facing the upper cover 30) of the vibration portion 120 so as to cover the entire surface of the vibration portion 120. In addition, a conductive film 236 is formed on a part of a surface of the insulating film 235 in each of the vibration arms 135A to 135D. The resonant frequency of the vibration portion 120 can be adjusted with the insulating film 235 and the conductive film 236. Although the insulating film 235 does not necessarily have to cover the entire surface of the vibration portion 120, the insulating film 235 preferably covers the entire surface of the vibration portion 120 to protect, from damage caused in frequency adjustment, an under electrode film such as a metal layer E2 in FIG. 4 and a piezoelectric film such as a piezoelectric thin film F3 in FIG. 4.

The conductive film 236 is formed, such that a surface of the conductive film 236 is exposed, on the insulating film 235 in at least a part of a region of the vibration portion 120 whose average displacement due to vibration is larger than that of the other region. Specifically, the conductive film 236 is formed at the tip of the vibration arm 135, that is, at the weight portion G. On the other hand, the surface of the insulating film 235 is exposed in the other region of the vibration arm 135. In the embodiment, the conductive film 236 is formed so as to reach the tip of the vibration arm 135, and the insulating film 235 is not exposed at the tip portion in the least. The conductive film 236 can also be configured not to be formed at the tip portion of the vibration arm 135 to expose a part of the insulating film 235. Moreover, a second conductive film may be formed at a part closer to the base of the vibration arm 135 (e.g., a part closer to the position where the vibration arm 135 is connected to the base 130). In this case, a change in frequency temperature characteristics due to frequency adjustment can be reduced.

The holding portion 140 (or simply the "frame") is formed into a rectangular frame shape along the XY-plane. The holding portion 140 has a frame shape in plan view and is disposed so as to surround the outer side portion of the vibration portion 120 along the XY-plane. As described above, the configuration in which the holding portion 140 has a frame shape in plan view enables the holding portion 140 surrounding the vibration portion 120 to be easily realized.

The holding portion 140 is simply required to be disposed in at least a part of the vicinity of the vibration portion 120, and the shape of the holding portion 140 is not limited to a frame shape. The holding portion 140 is simply required to be disposed around the vibration portion 120 such that, for example, the holding portion 140 holds the vibration portion 120 and is joined to the upper cover 30 and the lower cover 20.

In the present embodiment, the holding portion 140 includes frames 140a to 140d, which have a rectangular columnar shape and are integrally formed. As illustrated in FIG. 3, the frame 140a is disposed so as to face the open ends of the vibration arms 135 with the long-side direction of the frame 140a parallel to the X-axis. As further shown, the frame 140b is disposed so as to face the rear end 131B of the base 130 with the long-side direction of the frame 140b parallel to the X-axis. The frame 140c is disposed so as to face a side end (short side 131c) of the base 130 and the vibration arm 135A with the long-side direction of the frame 140c parallel to the Y-axis. The frame 140c is connected to one end of the frame 140a and one end of the frame 140b at the corresponding ends of the frame 140c. The frame 140d is disposed so as to face a side end (short side 131d) of the base 130 and the vibration arm 135D with the long-side direction of the frame 140d parallel to the Y-axis. The frame 140d is connected to the other end of the frame 140a and the other end of the frame 140b at the corresponding ends of the frame 140d.

In the exemplary aspect, the substantially entire surface of the holding portion 140 is covered with the insulating film 235.

Moreover, the holding arms 111 and 112 are disposed inside the holding portion 140 and respectively connect the rear end 131B of the base 130 to the frame 140c and the rear end 131B of the base 130 to the frame 140d. As illustrated in FIG. 3, the holding arms 111 and 112 are formed substantially symmetrically with respect to the imaginary plane P defined parallel to the YZ-plane along a center line of the base 130 in the X-axis direction.

As further shown, the holding arm 111 includes arms 111a, 111b, 111c, and 111d. One end of the holding arm 111 is connected to the rear end 131B of the base 130, and the holding arm 111 extends from the rear end 131B toward the frame 140b. The holding arm 111 then bends in a direction toward the frame 140c (that is, the X-axis direction). In addition, the holding arm 111 bends in a direction toward the frame 140a (that is, the Y-axis direction). The holding arm 111 bends in the direction toward the frame 140c (that is, the X-axis direction) again, and the other end of the holding arm 111 is connected to the frame 140c.

The arm 111a is disposed between the base 130 and the frame 140b so as to face the frame 140c with the long-side direction of the arm 111a parallel to the Y-axis. One end of the arm 111a is connected to the base 130 at the rear end 131B, and the arm 111a extends, from the rear end 131B, substantially perpendicularly to the rear end 131B, that is, in the Y-axis direction. An axis passing through the center of the arm 111a in the X-axis direction is preferably disposed more inside than a center line of the vibration arm 135A. In the example in FIG. 3, the arm 111a is disposed between the vibration arms 135A and 135B. The other end of the arm 111a is connected to one end of the arm 111b at a side surface of the other end of the arm 111a. The width of the arm 111a defined in the X-axis direction is about 20 µm. The length of the arm 111a defined in the Y-axis direction is 40 µm.

The arm 111b is disposed between the base 130 and the frame 140b so as to face the frame 140b with the long-side direction of the arm 111b parallel to the X-axis direction. The one end of the arm 111b is connected to the side surface facing the frame 140c of the other end of the arm 111a, and the arm 111b extends, from the side surface, substantially perpendicularly to the arm 111a, that is, in the X-axis direction. The other end of the arm 111b is connected to the side surface facing the vibration portion 120 of one end of the arm 111c. The width of the arm 111b defined in the Y-axis direction is, for example, about 20 µm. The length of the arm 111b defined in the X-axis direction is, for example, about 75 µm.

The arm 111c is disposed between the base 130 and the frame 140c so as to face the frame 140c with the long-side direction of the arm 111c parallel to the Y-axis direction. The one end of the arm 111c is connected to the other end of the arm 111b at the side surface of the one end of the arm 111c. The other end of the arm 111c is connected to one end of the arm 111d. The width of the arm 111c defined in the X-axis direction is, for example, about 20 µm. The length of the arm 111c defined in the Y-axis direction is, for example, about 140 µm.

The arm 111d is disposed between the base 130 and the frame 140c so as to face the frame 140a with the long-side direction of the arm 111d parallel to the Y-axis direction. The one end of the arm 111d is connected to the side surface facing the frame 140c of the other end of the arm 111c. The other end of the arm 111d is connected to the frame 140c at a position facing the vicinity of the part where the vibration arm 135A and the base 130 are connected. The arm 111d extends, from the position, substantially perpendicularly to the frame 140c, that is, in the X-axis direction. The width of the arm 111d defined in the Y-axis direction is, for example, about 20 µm. The length of the arm 111d defined in the X-axis direction is, for example, about 10 µm.

As described above, the holding arm 111 is configured to be connected to the base 130 at the arm 111a, to bend at the part where the arm 111a and the arm 111b are connected, the part where the arm 111b and the arm 111c are connected, and the part where the arm 111c and the arm 111d are connected, and to be then connected to the holding portion 140.

Similarly, the holding arm 112 includes arms 112a, 112b, 112c, and 112d. One end of the holding arm 112 is connected to the rear end 131B of the base 130, and the holding arm 112 extends from the rear end 131B toward the frame 140b. The holding arm 112 then bends in a direction toward the frame 140d (that is, the X-axis direction). In addition, the holding arm 112 bends in the direction toward the frame 140a (that is, the Y-axis direction). The holding arm 112 bends in the direction toward the frame 140d (that is, the X-axis direction) again, and the other end of the holding arm 112 is connected to the frame 140d.

Otherwise, it is noted that the configuration of the arms 112a, 112b, 112c, and 112d is symmetrical to the configuration of the arms 111a, 111b, 111c, and 111d and is thus not specifically described.

Figure 6:
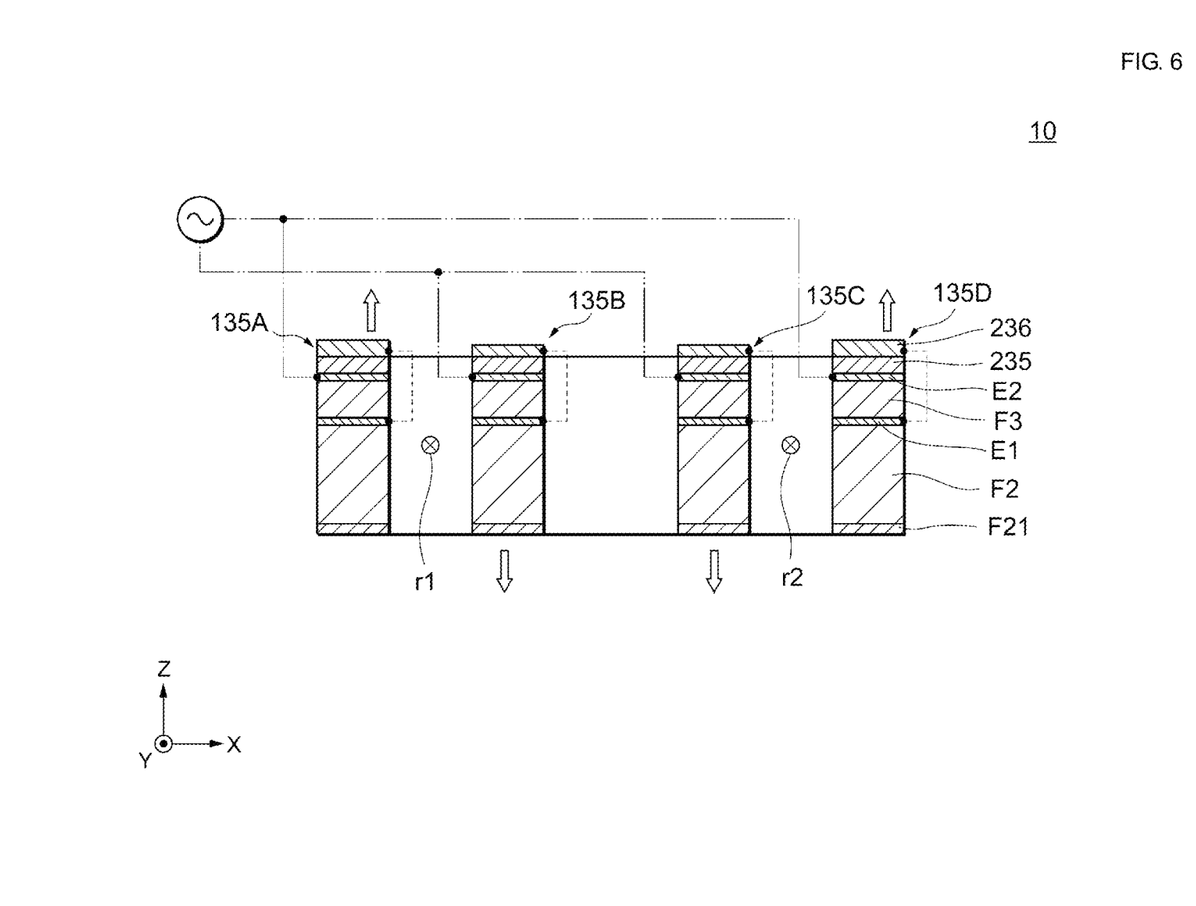
FIG. 6 is a sectional view schematically illustrating the configuration of a section of the resonator along line VI-VI illustrated in FIG. 3.

The vias V1, V2, V3, and V4 are holes that are filled with a metal and that are formed close to the respective tip portions of the vibration arms 135. In the exemplary aspect, the vias V1, V2, V3, and V4 electrically couple the conductive film 236, which is formed on each of the vibration arms 135A to 135D, to the metal layer E2 (described later with regard to FIG. 6, for example). In FIG. 6, dashed lines represent electrical coupling, and, in particular, dotted lines represent electrical coupling through the vias V1, V2, V3, and V4.

The vias V1, V2, V3, and V4 are each formed close to the boundary between the region in which the conductive film 236 is exposed and the region in which the insulating film 235 is exposed in a corresponding one of the tip portions of the vibration arms 135A, 135B, 135C, and 135D. This will be specifically described later. In the present embodiment, the vias V1, V2, V3, and V4 are formed in the corresponding end portions closer to the fixed ends of the weight portions G.

Vias V6 and V7 are preferably formed close to the part where the holding portion 140 and the holding arm 111 or 112 are connected. In the example in FIG. 3, the via V6 is formed close to the part where the frame 140c and the holding arm 111 (arm 111d) are connected, and the via V7 is formed close to the part where the frame 140d and the holding arm 112 (arm 112d) are connected. It is noted that the positions where the vias V6 and V7 are formed are not limited to this example, and the vias V6 and V7 may be formed at any position in the holding portion 140 in alternative aspects.

A terminal for connecting the metal layer E2 (e.g., the upper electrode) described later to an external drive power supply is formed in each of the vias V6 and V7. This configuration enables supply of drive power to the vibration portion 120.

The projection 50 is formed on the lower cover 20 so as to project between the vibration arms 135B and 135C. In the present embodiment, the projection 50 is formed into a rectangular columnar shape extending parallel to the vibration arms 135B and 135C. The length of the projection 50 in a direction along the vibration arm 135 is about 240 µm. The length (width) of the projection 50 orthogonal to the direction along the vibration arm 135 is about 15 µm. The number of the projections 50 is not limited to one and may be two or more.

Figure 4:
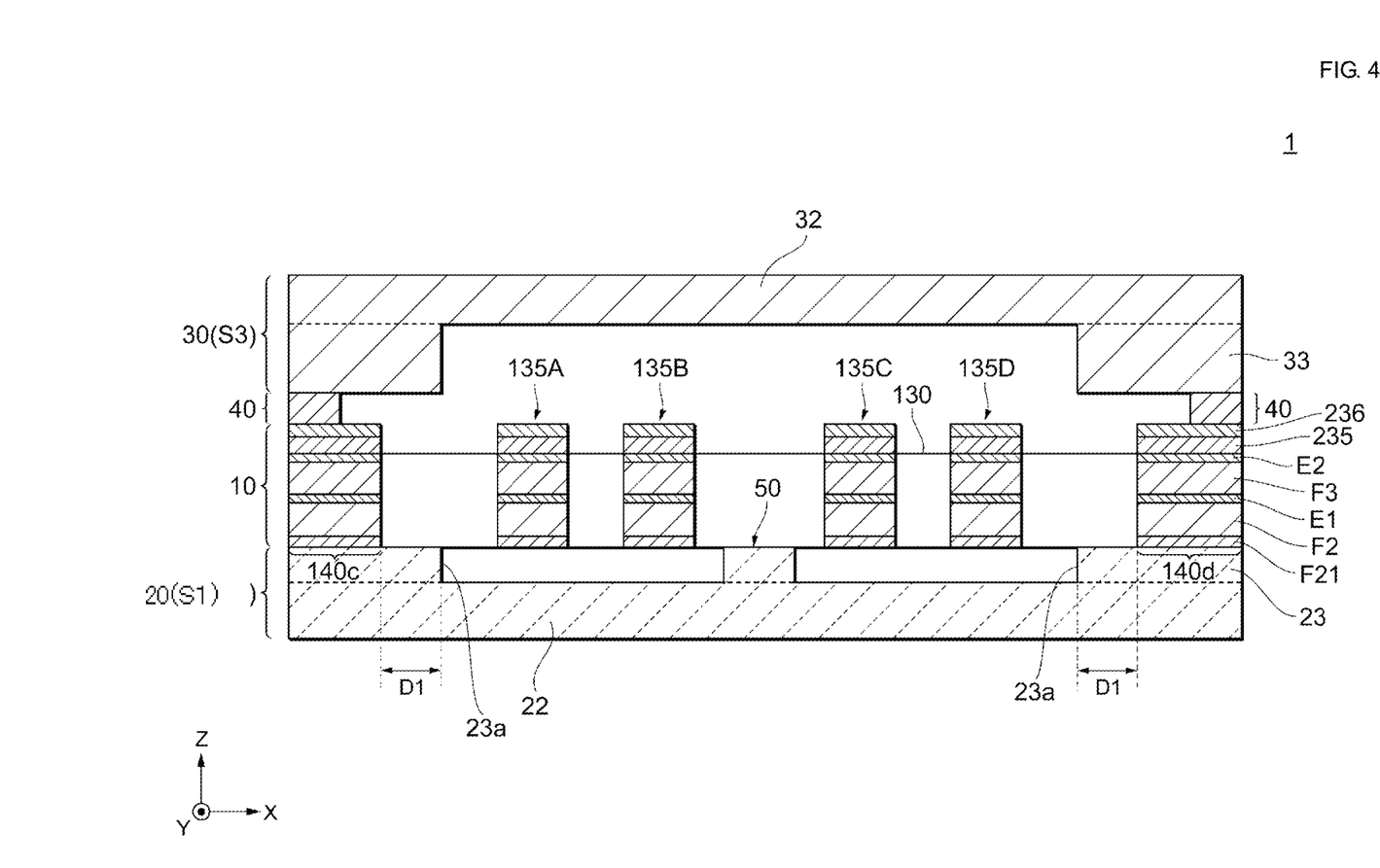
FIG. 4 is a sectional view schematically illustrating the configuration of a section of the resonance device along line IV-IV illustrated in FIG. 2.
Figure 5:
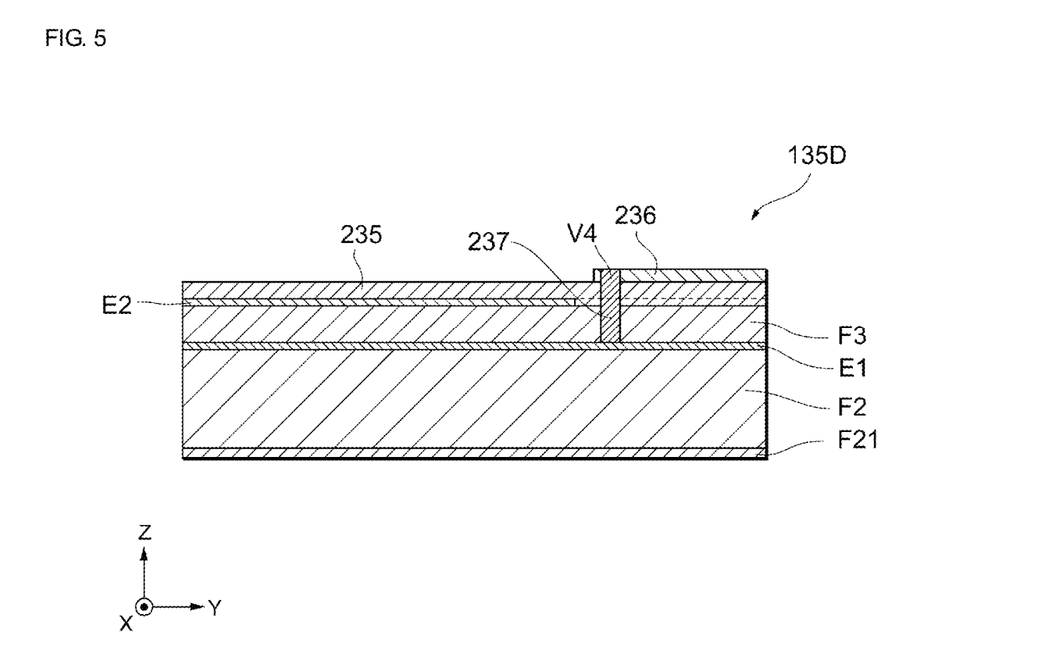
FIG. 5 is a sectional view schematically illustrating the configuration of a section of a vibration arm along line V-V illustrated in FIG. 3.

Next, the laminated structure of the resonance device 1 according to an embodiment of the present invention will be described with reference to FIGS. 4 to 6. FIG. 4 is a sectional view schematically illustrating the configuration of a section of the resonance device 1 along line IV-IV illustrated in FIG. 2. FIG. 5 is a sectional view schematically illustrating the configuration of a section of the vibration arm 135D along line V-V illustrated in FIG. 3. FIG. 6 is a sectional view schematically illustrating the configuration of a section of the resonator 10 along line VI-VI illustrated in FIG. 3. The line IV-IV illustrated in FIG. 2 is a line parallel to the frames 140a and 140b.

As illustrated in FIG. 4, the upper cover 30 is made of a silicon (Si) wafer (hereinafter referred to as "Si wafer") S3, which has a predetermined thickness. The upper cover 30 and the holding portion 140 of the resonator 10 are joined, at the periphery (side wall 33) of the upper cover 30, by a joining layer 40 (described later). The surface facing the resonator 10 and the back surface of the upper cover 30 are preferably covered with a silicon oxide film (not illustrated). The silicon oxide film is formed on surfaces of the Si wafer S3 by, for example, oxidation of the surfaces of the Si wafer S3 or chemical vapor deposition (CVD).

Moreover, a terminal (not illustrated) is formed in the surface opposite to the surface facing the resonator 10 of the upper cover 30. The terminal is formed by filling a through hole formed in the upper cover 30 with a conductive material such as impurity-doped polycrystalline silicon (Poly-Si), copper (Cu), gold (Au), or impurity-doped monocrystalline silicon. The terminal is connected to the vias V6 and V7 and functions as wiring that electrically couples an external power supply to the resonator 10.

The bottom plate 22 and the side wall 23 of the lower cover 20 are integrally formed and made of a silicon (Si) wafer S1. The lower cover 20 and the holding portion 140 of the resonator 10 are joined by an upper surface of the side wall 23. The thickness of the lower cover 20 defined in the Z-axis direction is, for example, 150 μm. The depth of the recess 21 defined in the Z-axis direction is, for example, 50 μm. The Si wafer S1 is made of non-degenerate silicon having a resistivity of, for example, 16 mΩ·cm or more.

The joining layer 40 is formed between the periphery of the upper cover 30 and the holding portion 140. The upper cover 30 and the holding portion 140 are joined by the joining layer 40. The joining layer 40 is made of, for example, a gold (Au) film and a tin (Sn) film.

The projection 50 is integrally formed with the Si wafer S1 of the lower cover 20. The projection 50 projects between the vibration arms 135B and 135C from the bottom plate 22 of the lower cover 20. As described above, the projection 50 is disposed between the vibration arms 135B and 135C and projects from the bottom plate 22 of the lower cover 20. As a result, it is possible to increase the rigidity of the lower cover 20 and to reduce the occurrence of deflection of the resonator 10 formed on the lower cover 20 and the occurrence of a warp in the lower cover 20.

The holding portion 140, the base 130, the vibration arms 135, and the holding arms 111 and 112 of the resonator 10 are integrally formed by the same process. In the resonator 10, a metal layer E1 is laminated on a silicon (Si) substrate, which is an example of a substrate, (hereinafter referred to as "Si substrate F2"). The piezoelectric thin film F3 is then laminated on the metal layer E1 so as to cover the metal layer E1. In addition, the metal layer E2 is laminated on a surface of the piezoelectric thin film F3. The insulating film 235 is laminated on the metal layer E2 so as to cover the metal layer E2. In addition, on the vibration portion 120, the conductive film 236 is laminated on the insulating film 235. In the present embodiment, the metal layer E2 is configured not to extend to the tips of the vibration arms 135. This configuration enables characteristic changes due to shorting between the metal layer E2 and the metal layer E1 or the conductive film 236 to be reduced. As described above, although patterning is preferably performed such that the metal layer E2 does not extend to the tips of the vibration arms 135, the metal layer E2 may extend to the tips of the vibration arms 135. When a degenerate silicon substrate having a low resistance is used for the Si substrate F2, the Si substrate F2 can also serve as the metal layer E1, and it is also possible to omit the metal layer E1. The metal layer E1 corresponds to an example of "first electrode" in an exemplary aspect of the present disclosure. The metal layer E2 corresponds to an example of "second electrode" in an exemplary aspect of the present disclosure.

The Si substrate F2 is made of, for example, a degenerate n-type silicon (Si) semiconductor having a thickness of about 6 μm and can contain, for example, phosphorus (P), arsenic (As), or antimony (Sb) as an n-type dopant. The resistivity of degenerate Si used for the Si substrate F2 is, for example, less than 1.6 mΩ·cm, more preferably 1.2 mΩ·cm or less. In addition, a silicon oxide (for example, $SiO_2$) layer F21 is formed, as an example of a temperature-characteristic correction layer, on a lower surface of the Si substrate F2. This configuration enables an improvement in temperature characteristics.

In the present embodiment, the silicon oxide layer F21 is a layer constructed for having a function of reducing, at at least a temperature close to room temperature, the temperature coefficient of the frequency, that is, the rate of change in the frequency, per unit temperature change, of the vibration portion 120 in which a temperature-characteristic correction layer is formed on the Si substrate F2 compared with the case in which the silicon oxide layer F21 is not formed on the Si substrate F2. The vibration portion 120 includes the silicon oxide layer F21, and as a result it is possible to reduce changes, due to temperature changes, in the resonant frequency of the laminated structure composed of the Si substrate F2, the metal layers E1 and E2, the piezoelectric thin film F3, and the silicon oxide layer F21, for example. The silicon oxide layer F21 and the Si substrate F2 in the holding portion 140 correspond to an example of "holding body" in an exemplary aspect of the present disclosure.

In the resonator 10, the silicon oxide layer F21 is preferably formed so as to have a uniform thickness. For purposes of this disclosure, it is noted that the uniform thickness denotes the thickness of the silicon oxide layer F21 whose variations are within a range of ±20% of the average thickness thereof.

The silicon oxide layer F21 may be formed on an upper surface of the Si substrate F2 and formed on both the upper surface and the lower surface of the Si substrate F2. In the holding portion 140, the silicon oxide layer F21 does not have to be formed on the lower surface of the Si substrate F2.

The metal layers E1 and E2 each have a thickness of, for example, about 0.1 μm or more and about 0.2 μm or less. The metal layers E1 and E2 are each patterned into a desired shape by, for example, etching after a film-forming process. The metal layers E1 and E2 are made of, for example, molybdenum (Mo) or tungsten (W). As described above, the metal layers E1 and E2 each preferably contain, as a main component, a metal whose crystal structure is a body-centered cubic structure. This configuration enables the metal layers E1 and E2 respectively suitable for a lower electrode and an upper electrode of the resonator 10 to be easily realized.

The metal layer E1 is formed so as to function as, for example, a lower electrode, a float electrode, or a ground electrode in the vibration portion 120. In the present embodiment, the metal layer E1 is configured as a lower electrode. In addition, the metal layer E1 is formed so as to function as wiring, on the holding arms 111 and 112 or the holding portion 140, for connecting a lower electrode or a ground electrode to an alternating-current power supply disposed outside the resonator 10.

On the other hand, the metal layer E2 is formed so as to function as an upper electrode in the vibration portion 120. In addition, the metal layer E2 is formed so as to function as wiring, on the holding arms 111 and 112 or the holding portion 140, for connecting an upper electrode to a circuit disposed outside the resonator 10.

A configuration in which an electrode is formed on an outer surface of the upper cover 30 and connects the circuit to lower wiring or upper wiring or a configuration in which a via formed in the upper cover 30 is filled with a conductive material to prepare wiring that connects the alternating-current power supply to the lower wiring or the upper wiring may be used to connect the alternating-current power supply or a ground to the lower wiring or the upper wiring.

Moreover, in an exemplary aspect, the piezoelectric thin film F3 is a thin film made of a piezoelectric material that converts an applied voltage into vibration.

The piezoelectric thin film F3 can contain, as a main component, for example, a nitride or an oxide such as aluminum nitride (AlN), scandium aluminum nitride (ScAlN), zinc oxide (ZnO), gallium nitride (GaN), or indium nitride (InN). In scandium aluminum nitride, a part of aluminum in aluminum nitride is substituted with scandium and may be substituted with, in place of scandium, two chemical elements such as magnesium (Mg) and niobium (Nb) or magnesium (Mg) and zirconium (Zr). As described above, the piezoelectric thin film F3 preferably contains, as a main component, a piezoelectric material whose crystal structure is a hexagonal wurtzite structure. This configuration enables the piezoelectric thin film F3 suitable for the resonator 10 to be easily realized.

The piezoelectric thin film F3 in the vibration portion 120 and the piezoelectric thin film F3 in the holding portion 140 may be made of different materials in one exemplary aspect. However, the piezoelectric thin film F3 in the vibration portion 120 and the piezoelectric thin film F3 in the holding portion 140 are preferably made of the same material. This configuration enables the vibration portion 120 and the holding portion 140 to be formed by the same process and the manufacturing process of the resonator 10 to be simplified.

The piezoelectric thin film F3 has a thickness of, for example, 1 μm or can also have a thickness of about 0.2 to 2 μm.

The piezoelectric thin film F3 expands and contracts in the in-plane direction of the XY-plane, that is, the Y-axis direction, in response to an electric field applied to the piezoelectric thin film F3 by the metal layers E1 and E2. By expanding and contracting the piezoelectric thin film F3, the open ends of the vibration arms 135 are displaced toward each inner surface of the lower cover 20 and the upper cover 30, and the vibration arms 135 are vibrated in an out-of-plane bending vibration mode.

In the present embodiment, in the out-of-plane bending vibration mode using four arms, two inner arms and two outer arms are configured to bend and vibrate in respective directions opposite to each other by dividing the upper electrode and connecting each divided upper electrode to the alternating-current power supply. However, it is noted that the exemplary embodiment of the present invention is not limited thereto. For example, a configuration in which the number of vibration arms is one or a configuration in which vibration is performed in an in-plane bending vibration mode may be used.

The insulating film 235 is a layer made of an insulating material. In one aspect, the insulating film 235 is made of a material whose mass reduction rate in etching is slower than that of the conductive film 236. The mass reduction rate is expressed by an etching rate, that is, the product of a density and a thickness by which thickness reduction is performed per unit time.

The insulating film 235 is formed by a piezoelectric film made of, for example, aluminum nitride (AlN), scandium aluminum nitride (ScAlN), zinc oxide (ZnO), gallium nitride (GaN), or indium nitride (InN), or an insulating film made of, for example, silicon nitride (SiN), silicon dioxide ($SiO_2$), aluminum oxide ($Al_2O_3$), or tantalum pentoxide ($Ta_2O_5$).

The insulating film 235 is formed so as to have a thickness half or less of the thickness of the piezoelectric thin film F3. In the present embodiment, the insulating film 235 has a thickness of, for example, about 0.2 μm. More preferably, the thickness of the insulating film 235 is about a quarter of the thickness of the piezoelectric thin film F3. In addition, when the insulating film 235 is made of a piezoelectric material such as aluminum nitride (AlN), a piezoelectric material whose orientation is the same as that of the piezoelectric thin film F3 is preferably used for the insulating film 235.

The conductive film 236 is a layer made of a conductive material. The conductive film 236 is formed on the substantially entire surface of the vibration portion 120 and is then formed only in a predetermined region by processing such as etching. The conductive film 236 is made of a material whose mass reduction rate in etching is faster than that of the insulating film 235. The conductive film 236 is made of a metal such as molybdenum (Mo), tungsten (W), gold (Au), platinum (Pt), nickel (Ni), aluminum (Al), or titanium (Ti).

The etching rate of the insulating film 235 and the etching rate of the conductive film 236 may have any relationship as long as the above relationship between the mass reduction rate of the insulating film 235 and the mass reduction rate of the conductive film 236 is satisfied.

In the resonance device 1 according to the exemplary embodiment, a trimming process in which the film thickness of the conductive film 236 is adjusted is performed after the formation of the resonator 10 described above.

In the trimming process, first, the resonant frequency of the resonator 10 is measured, and a deviation from a target frequency is calculated. Subsequently, the film thickness of the conductive film 236 is adjusted on the basis of the calculated frequency deviation. The film thickness of the conductive film 236 can be adjusted by, for example, irradiating the entire surface of the resonance device 1 with an argon (Ar) ion beam to etch the conductive film 236. It is possible to irradiate an area wider than that of the resonator 10 with an ion beam. The exemplary embodiment illustrates an example in which etching is performed with an ion beam, but it is noted that the etching method is not limited thereto. In addition, it is preferable to clean the resonator 10 and to remove scattered films after the adjustment of the film thickness of the conductive film 236.

As illustrated in FIG. 5, the metal layer E2 is formed by adjusting the area thereof such that the region in which the metal layer E2 and the conductive film 236 overlap each other is as small as possible.

The via V4 is formed by filling, with a conductive material 237, a hole that is formed by removing a part of the insulating film 235, a part of the metal layer E2, and a part of the piezoelectric thin film F3 so as to expose a surface of the metal layer E1. The conductive material 237, with which the via V4 is filled, is molybdenum (Mo) or aluminum (Al), for example. The conductive film 236 and the metal layer E1 are electrically coupled via the conductive material 237, with which the via V4 is filled. This configuration enables the electric charge borne by the insulating film 235 to move to the metal layer E1. The electric charge that has moved to the metal layer E1 can be then discharged to the outside of the resonance device 1 via a connection terminal for connection with the outside, the connection terminal being connected to the metal layer E1. As described above, the resonator 10 according to the present embodiment can inhibit an electric charge from being borne by the insulating film 235 formed on the vibration portion 120 and can thus prevent the resonant frequency of the resonator 10 from changing due to the electric charge borne by the vibration portion 120.

When the metal layer E1 and the conductive film 236 are connected to each other, respective electric fields whose directions are opposite to each other are applied to the insulating film 235 and the piezoelectric thin film F3. Thus, when the region in which the metal layer E2 and the conductive film 236 overlap each other is large, the vibration of the resonator 10 is hindered. The resonator 10 according to the present embodiment is set such that the region in which the metal layer E2 and the conductive film 236 overlap each other is as small as possible. This configuration enables hindrance to the vibration of the piezoelectric thin film F3 due to the electric field applied to the insulating film 235 to be reduced. For example, the connection configuration and the effect of the vias V1, V2, and V3, and the material for the vias V1, V2, and V3 are similar to those of the via V4 and are thus not illustrated and described.

As illustrated in FIG. 6, in the present embodiment, the phase of the electric field applied to the vibration arms 135A and 135D, which are positioned on the outside, and the phase of the electric field applied to the vibration arms 135B and 135C, which are positioned on the inside, are set to be opposite to each other. Thus, the vibration arms 135A and 135D on the outside and the vibration arms 135B and 135C on the inside are displaced in the respective directions opposite to each other. For example, when the open ends of the vibration arms 135A and 135D on the outside are displaced toward the inner surface of the upper cover 30, the open ends of the vibration arms 135B and 135C on the inside are displaced toward the inner surface of the lower cover 20.

Thus, in the resonator 10 according to the present embodiment, when the vibration arms 135A and 135B vibrate in the respective phases opposite to each other, the vibration arms 135A and 135B vibrate in the respective up-down directions opposite to each other around a central axis r1 extending parallel to the Y-axis. In addition, when the vibration arms 135C and 135D vibrate in the respective phases opposite to each other, the vibration arms 135C and 135D vibrate in the respective up-down directions opposite to each other around a central axis r2 extending parallel to the Y-axis. This causes torsional moments in the directions opposite to each other to be generated at the respective central axes r1 and r2 and the base 130 to thus bend and vibrate.

Hereinafter, the positional relationship between the holding portion 140 and the side wall 23 of the lower cover 20 will be described.

In the related art, the inside side surface (hereinafter referred to as "inner side surface") of the holding portion 140 is disposed so as to coincide or substantially coincide with an inner surface 23a of the side wall 23. Thus, the holding portion 140 including the insulating film 235 is disposed around the vibration portion 120 including the vibration arms 135.

The insulating film 235 of the holding portion 140 may be electrified due to various factors. The insulating film 235 of the holding portion 140 is electrified due to, for example, an electric field generated during thin film formation in the resonator 10. In addition, when a film for frequency adjustment is formed on the vibration portion 120, and the resonant frequency is adjusted by using, for example, an ion beam, the holding portion 140 is also irradiated with an ion beam, and as a result the insulating film 235 of the holding portion 140 is electrified. In addition, when a pyroelectric material is used for the insulating film 235, an electric charge is generated at the interface of the insulating film 235 due to a pyroelectric effect caused by temperature changes.

When the insulating film 235 of the holding portion 140 disposed around the vibration portion 120 is electrified due to these factors, a Coulomb force (i.e., an electrostatic force) is generated by the electric charge at the insulating film 235, and the spring constant of the vibration portion 120 thus changes. As a result, the resonant frequency changes.

On the other hand, in the present embodiment, as illustrated in FIG. 4, the inner side surface of the frame 140c is disposed at a first distance D1 from the inner surface 23a of the side wall 23. Similarly, the inner side surface of the frame 140d is disposed at the first distance D1 from the inner surface 23a of the side wall 23.

In addition, similarly, each inner side surface of the frames 140a and 140b (not illustrated) is also disposed at the first distance D1 from the inner surface 23a of the side wall 23. The first distance D1 is not limited to the same first distance D1 at which each inner side surface of the frames 140a to 140d is disposed and may be substantially the same first distance D1.

As described above, the inner side surface of the insulating film 235 included in the holding portion 140 is disposed at the first distance D1 from the inner surface 23a of the side wall 23. Thus, it is possible to increase the distance between the holding portion 140 and the vibration portion 120 including the vibration arms 135 compared with the case in which the inner side surface of the insulating film 235 is disposed at no distance from the inner surface 23a of the side wall 23. Accordingly, it is possible to reduce the generation, around the vibration portion 120, of the electric charge borne by the insulating film 235 of the holding portion 140. As a result, it is possible to reduce the influence, on the resonant frequency, of the electric charge borne by the insulating film 235 of the holding portion 140.

Preferably, the first distance D1 is, for example, 5 µm or more and 50 µm or less. This configuration enables the influence, on the resonant frequency, of the electric charge at the holding portion 140 to be effectively reduced with the resonance device 1 reduced in thickness and size.

In an exemplary aspect, to dispose the inner side surface of the holding portion 140 at a distance from the inner surface 23a of the side wall 23, the etching width of the holding portion 140 is required to be larger than that in the related art when a part between the vibration arms 135 and the holding portion 140 is released by, for example, etching. As described above, the inner side surface of the holding portion 140 can be disposed at the first distance D1 from the inner surface 23a of the side wall 23 without increasing the number of masks or forming processes. Thus, it is possible to reduce the influence, on the resonant frequency, of the electric charge at the holding portion 140 at a low cost.

Second Exemplary Embodiment

Next, a second exemplary embodiment (hereinafter referred to as "Embodiment 2") will be described. For Embodiment 2, points in common with Embodiment 1 are not described, and only different points are described. In particular, similar operational effects resulting from similar configurations are not mentioned in each embodiment.

Figure 7:
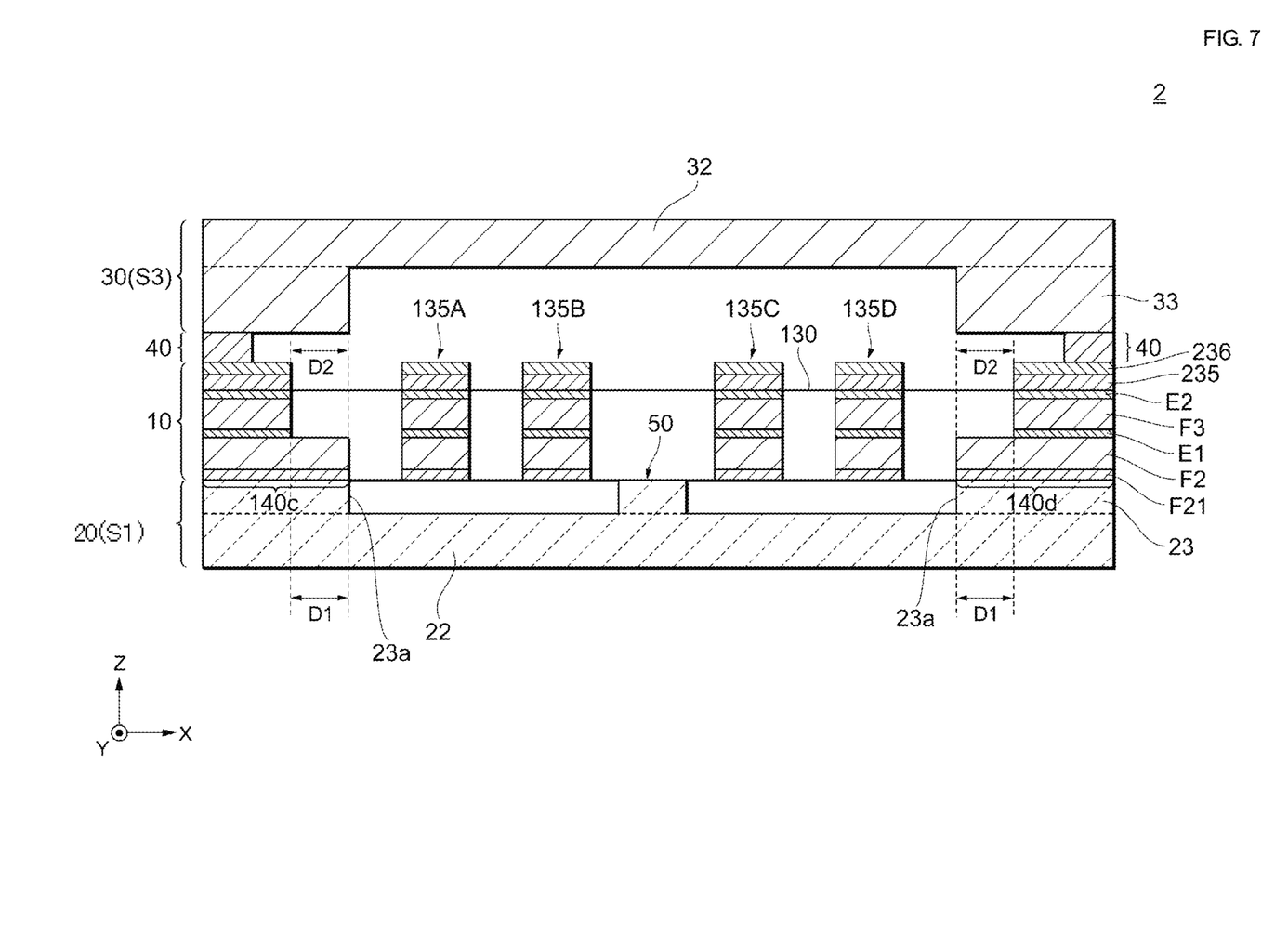
FIG. 7 is a sectional view schematically illustrating the configuration of a resonance device according to a second exemplary embodiment.

FIG. 7 is a sectional view schematically illustrating the configuration of a resonance device 2 according to Embodiment 2 of the present invention. FIG. 7 is a figure corresponding to FIG. 4 in Embodiment 1.

As illustrated in FIG. 7, in the resonance device 2, a step is formed in a part of the holding portion 140. That is, each inner side surface of the silicon oxide layer F21 and the Si substrate F2 in the holding portion 140 is disposed so as to substantially coincide with the inner surface 23a of the side wall 23. Each inner side surface of the silicon oxide layer F21 and the Si substrate F2 in the frame 140c may project in the positive X-axis direction. Each inner side surface of the silicon oxide layer F21 and the Si substrate F2 in the frame 140d may project in the negative X-axis direction.

On the other hand, in the holding portion 140, each inner side surface of the metal layer E1, the piezoelectric thin film F3, the metal layer E2, the insulating film 235, and the conductive film 236 is disposed at the first distance D1 from the inner surface 23a of the side wall 23.

In addition, in the holding portion 140, each inner side surface of the metal layer E1, the piezoelectric thin film F3, the metal layer E2, the insulating film 235, and the conductive film 236 is disposed at a second distance D2 from each inner side surface of the silicon oxide layer F21 and the Si substrate F2. The second distance D2 from each inner side surface of the silicon oxide layer F21 and the Si substrate F2 is set to be equal to or more than the first distance D1 from the inner surface 23a of the side wall 23 (i.e., second distance D2 first distance D1).

As described above, in the holding portion 140, the inner side surface of the insulating film 235 is disposed at the second distance D2 equal to or more than the first distance D1 from each inner side surface of the silicon oxide layer F21 and the Si substrate F2. Thus, the silicon oxide layer F21 and the Si substrate F2 of the holding portion 140 are disposed close to the vibration portion 120. Accordingly, for example, when the vibration arms 135 of the vibration portion 120 are displaced due to an impact applied to the resonator 10, the silicon oxide layer F21 and the Si substrate F2 of the holding portion 140 function as a stopper and can reduce the displacement of the vibration arms 135. As a result, it is possible to prevent the vibration arms 135 from being broken.

To dispose each inner side surface of the metal layer E1, the piezoelectric thin film F3, the metal layer E2, the insulating film 235, and the conductive film 236 in the holding portion 140 at a distance from each inner side surface of the silicon oxide layer F21 and the Si substrate F2, first, the metal layer E1, the piezoelectric thin film F3, the metal layer E2, the insulating film 235, and the conductive film 236 are removed by, for example, etching, and the silicon oxide layer F21 and the Si substrate F2 are left. As a result, a recess is formed in a part to be the holding portion 140 in the resonator 10. Subsequently, a part between the vibration arms 135 and the holding portion 140 is released by, for example, etching.

It is noted that exemplary embodiments of the present invention are described above. In a resonance device according to an embodiment of the present invention, an inner side surface of an insulating film included in a holding portion is disposed at a first distance from an inner surface of a side wall defining a recess. Thus, it is possible to increase the distance between the holding portion and a vibration portion including vibration arms compared with the case in which the inner side surface of the insulating film is disposed at no distance from the inner surface of the side wall. Accordingly, the generation, around the vibration portion, of the electric charge borne by the insulating film of the holding portion can be reduced. As a result, the influence, on the resonant frequency, of the electric charge borne by the insulating film of the holding portion can also be reduced.

In addition, in the resonance device, the inner side surface of the insulating film in the holding portion is disposed at a second distance equal to or more than the first distance from each inner side surface of a silicon oxide layer and a Si substrate. Thus, the silicon oxide layer and the Si substrate of the holding portion are disposed close to the vibration portion. Accordingly, for example, when the vibration arms of the vibration portion are displaced due to an impact applied to a resonator, the silicon oxide layer and the Si substrate of the holding portion function as a stopper and can reduce the displacement of the vibration arms. As a result, the vibration arms can be prevented from being broken.

In addition, in the resonance device, the first distance is 5 μm or more and 50 μm or less. This configuration enables the influence, on the resonant frequency, of the electric charge at the holding portion to be effectively reduced with the resonance device reduced in thickness and size.

In addition, in the resonance device, the holding portion has a frame shape when a main surface of the resonator is viewed in plan view. This configuration enables the holding portion surrounding the vibration portion to be easily realized.

In addition, in the resonance device, a projection is disposed between adjacent two of the vibration arms and projects from the recess. As a result, it is possible to increase the rigidity of a lower cover and to reduce the occurrence of deflection of the resonator formed on the lower cover and the occurrence of a warp in the lower cover.

In addition, in the resonance device, a piezoelectric thin film contains, as a main component, a piezoelectric material having a hexagonal wurtzite structure. This configuration enables a piezoelectric thin film suitable for the resonator to be easily realized.

In addition, in the resonance device, the piezoelectric thin film in the holding portion and the piezoelectric thin film in the vibration portion are made of the same material. This configuration enables the vibration portion and the holding portion to be formed by the same process and the manufacturing process of the resonator to be simplified.

In addition, in the resonance device, at least one of metal layers contains, as a main component, a metal having a body-centered cubic structure. This configuration enables metal layers suitable for a lower electrode and an upper electrode of the resonator to be easily realized.

In addition, the resonance device includes an upper cover disposed so as to face the lower cover with the resonator interposed between the upper cover and the lower cover. This configuration enables the space in which the resonator vibrates to be airtightly sealed and to be maintained under a high vacuum.

The exemplary embodiments described above are intended to facilitate understanding of the present invention and are not intended to construe the present invention in any limiting manner. It should be appreciated that the present invention can be modified and improved without departing from the spirit of the present invention and includes equivalents thereof. That is, design changes appropriately made to each embodiment by those skilled in the art are also included in the scope of the present invention as long as the design changes have the features of the present invention. For example, the components in each embodiment, the dispositions, the materials, the conditions, the shapes, and the sizes of the components are not limited to those exemplified above and can be appropriately modified. Naturally, each embodiment is an exemplary embodiment, and configurations described in different embodiments can be partially substituted or combined. Such substitutions and combinations are also included in the scope of the present invention as long as the substitutions and combinations have the features of the present invention.

REFERENCE SIGNS LIST 1 resonance device
2 resonance device
10 resonator
20 lower cover
21 recess
22 bottom plate
23 side wall
23a inner surface
30 upper cover
31 recess
33 side wall
40 joining layer
50 projection
110 holding arm
111 holding arm
111a, 111b, 111c, 111d arm
112 holding arm
112a, 112b, 112c, 112d arm
120 vibration portion
130 base
131a long side
131A front end
131b long side
131B rear end
131c short side
131d short side
135, 135A, 135B, 135C, 135D vibration arm
140 holding portion
140a, 140b, 140c, 140d frame
235 insulating film
236 conductive film
237 conductive material
D1 first distance
D2 second distance
E1, E2 metal layer
F2 Si substrate
F3 piezoelectric thin film
F21 silicon oxide layer
G weight portion
P imaginary plane
r1, r2 central axis
S1 Si wafer
S3 Si wafer
V1, V2, V3, V4, V6, V7 via
W1, W2 distance

The invention claimed is:

1. A resonance device comprising:
a resonator including a vibration body and a frame disposed around at least a part of the vibration body, the frame including a holding body and an insulating film having an inner side surface that faces the resonator and extends in a thickness direction of the resonance device, with the holding body holding the vibration body, and with the insulating film disposed above the holding body; and
a first substrate coupled to the frame and having a recess that forms at least a part of a space in which the vibration body vibrates in operation, the space defined by a side wall that extends in the first substrate and defines a stepped planar surface that extends to the frame,
wherein the inner side surface of the insulating film is a first distance outside from an inner surface of the side wall defining the recess, such that the frame does not overlap or coincide with the side wall of the recess in the thickness direction.

2. The resonance device according to claim 1, wherein the vibration body further includes a piezoelectric film that contains a piezoelectric material having a hexagonal wurtzite structure.

3. The resonance device according to claim 2,
wherein the frame further includes a piezoelectric film, and
wherein the piezoelectric film in the frame and the piezoelectric film in the vibration body are made of an identical material.

4. The resonance device according to claim 3, wherein the vibration body further includes a first electrode and a second electrode that are disposed so as to face each other with the piezoelectric film interposed between the first electrode and the second electrode.

5. The resonance device according to claim 4, wherein at least one of the first electrode and the second electrode comprise a metal having a body-centered cubic structure.

6. The resonance device according to claim 4, wherein an inner side surface of each of the first electrode, the second electrode and the piezoelectric film are disposed at the first distance from the inner surface of the side wall defining the recess relative to a plan view of the first substrate.

7. The resonance device according to claim 1, wherein the vibration body includes a plurality of vibration arms extending from a base thereof.

8. The resonance device according to claim 7, wherein the first substrate includes a projection that is disposed between two adjacent vibration arms of the plurality of vibration arms and that projects from the recess.

9. The resonance device according to claim 1, wherein the holding body is constructed to hold the vibration body to vibrate during operation of the resonance device.

10. The resonance device according to claim 1, wherein the inner side surface of the insulating film is disposed at a second distance equal to or more than the first distance from an inner side surface of the holding body.

11. The resonance device according to claim 1, wherein the first distance extends in a direction orthogonal to the thickness direction of the resonance device and is equal to or more than 5 μm and less than or equal to 50 μm.

12. The resonance device according to claim 1, wherein the frame comprises a frame shape when a main surface of the resonator is viewed in a plan view.

13. The resonance device according to claim 1, further comprising a second substrate disposed so as to face the first substrate with the resonator interposed between the first substrate and the second substrate.

14. The resonance device according to claim 1, wherein a step is disposed in a portion of the frame to define the stepped planar surface, such that an inner side surface of the step substantially coincides with the inner surface of the side wall defining the recess.

15. The resonance device according to claim 1,
wherein the vibration body includes a plurality of vibration arms extending from a base thereof, and
wherein the first substrate includes a projection that is disposed between two adjacent vibration arms of the plurality of vibration arms and that projects from the recess.

16. A resonance device comprising:
a first substrate having a main surface with a recess extending therein and having an inner side wall defining the recess in the first substrate;
a resonator including a vibration body extending in or above the recess; and
a frame coupled to the first substrate and disposed around at least a part of the vibration body and having an inner side surface that faces the resonator and extends in a thickness direction of the resonance device, with the frame including a holding body arm coupled to the vibration body and an insulating film disposed above the holding body,
wherein the inner side wall of the recess further defines a stepped planar surface that extends to the frame, and
wherein an inner side surface of the insulating film is a first distance outside from the inner side wall defining the recess, such that the frame does not overlap or coincide with the inner side wall of the recess in the thickness direction of the resonance device.

17. The resonance device according to claim 16, wherein the inner side surface of the insulating film and the inner side wall defining the recess each extend in a direction orthogonal to the main surface of the first substrate.

18. The resonance device according to claim 16, wherein the inner side surface of the insulating film is disposed at a second distance equal to or more than the first distance from an inner side surface of the holding body.

19. The resonance device according to claim 16, wherein the first distance extends in a direction orthogonal to the thickness direction of the resonance device and is equal to or more than 5 μm and less than or equal to 50 μm.

20. The resonance device according to claim 16, further comprising a second substrate disposed so as to face the first substrate with the resonator interposed between the first substrate and the second substrate.

* * * * *